US012687902B2

(12) United States Patent
Wingfield

(10) Patent No.: US 12,687,902 B2
(45) Date of Patent: Jul. 21, 2026

(54) SYSTEMS AND METHODS FOR MOUNTING COMPONENTS TO AN INFORMATION HANDLING RESOURCE MODULE

(71) Applicant: Dell Products L.P., Round Rock, TX (US)

(72) Inventor: Megan Cherie Wingfield, Box Elder, SD (US)

(73) Assignee: Dell Products L.P., Round Rock, TX (US)

( * ) Notice: Subject to any disclaimer, the term of this patent is extended or adjusted under 35 U.S.C. 154(b) by 212 days.

(21) Appl. No.: 18/662,187

(22) Filed: May 13, 2024

(65) Prior Publication Data

US 2025/0348119 A1 Nov. 13, 2025

(51) Int. Cl.
*G06F 1/185* (2026.01)
*G06F 1/186* (2026.01)
*H05K 7/14* (2006.01)

(52) U.S. Cl.
CPC .............. *G06F 1/185* (2013.01); *G06F 1/186* (2013.01); *H05K 7/1402* (2013.01)

(58) Field of Classification Search
CPC ....... G06F 1/185; G06F 1/186; H05K 7/1402; H05K 7/1401
See application file for complete search history.

(56) References Cited

U.S. PATENT DOCUMENTS

| | | | | |
|---|---|---|---|---|
| 7,791,881 B2 * | 9/2010 | Chou | .................... | H10W 40/43 |
| | | | | 361/716 |
| 7,907,398 B2 * | 3/2011 | Hrehor, Jr. | ......... | H05K 7/20636 |
| | | | | 165/185 |
| 12,489,234 B2 * | 12/2025 | Tsai | .................... | H01R 13/6273 |
| 2012/0020004 A1 * | 1/2012 | Rau | ........................ | H10W 40/47 |
| | | | | 361/679.31 |
| 2012/0113586 A1 * | 5/2012 | Rau | ........................... | G06F 1/20 |
| | | | | 165/104.19 |
| 2013/0342987 A1 * | 12/2013 | Yang | ........................ | G06F 1/20 |
| | | | | 361/679.32 |
| 2022/0003511 A1 * | 1/2022 | Embleton | ............... | F28F 21/02 |
| 2024/0242740 A1 * | 7/2024 | Geng | .................... | H05K 1/181 |
| 2025/0203823 A1 * | 6/2025 | Zhang | ............... | H05K 7/20409 |

* cited by examiner

*Primary Examiner* — Nidhi Thaker
(74) *Attorney, Agent, or Firm* — Jackson Walker L.L.P.

(57) ABSTRACT

An information handling system may include a plurality of connectors and a mount structure configured to mechanically couple to a first connector and a second connector of the plurality of connectors. Each connector of the plurality of connectors may be configured to mechanically and electrically couple to a respective information handling resource.

15 Claims, 6 Drawing Sheets

SYSTEMS AND METHODS FOR MOUNTING COMPONENTS TO AN INFORMATION HANDLING RESOURCE MODULE

TECHNICAL FIELD

The present disclosure relates in general to information handling systems, and more particularly to mounting components to an information handling resource module in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems may often use one or more circuit boards. A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis. Often, such information handling resource may be mounted to a circuit board by forming one or more holes or openings in the circuit board and coupling the information handling resource to a mechanical feature threaded through the one or more holes.

However, each hole created in the circuit board may correspond to an associated keep out zone, e.g., areas around the hole that may not be used for electrical components or routing. Moreover, some information handling resources (e.g., dual inline memory modules or DIMMs) may be located in component-dense areas where such mounting holes may be unrealistic. Accordingly, systems and methods to mount information handling resources to the circuit board without forming holes in the circuit board may be desirable.

SUMMARY

In accordance with the teachings of the present disclosure, the disadvantages and problems associated with mounting information handling resources to a circuit board may be reduced or eliminated.

In accordance with embodiments of the present disclosure, an information handling system may include a plurality of connectors and a mount structure configured to mechanically couple to a first connector and a second connector of the plurality of connectors. Each connector of the plurality of connectors may be configured to mechanically and electrically couple to a respective information handling resource.

In accordance with embodiments of the present disclosure, a mount structure may be configured to mechanically couple to a first connector and a second connector of a plurality of connectors, wherein each connector may be configured to mechanically and electrically couple to a respective information handling resource. The mount structure may include a first support structure, a second support structure, and a top support structure. The first support structure may include a first attachment mechanism configured to mechanically couple to the first connector. The second support structure may include a second attachment mechanism configured to mechanically couple to the second connector. And the top support structure may connect the first support structure and the second support structure and may include a plurality of alignment features configured to mechanically couple to one or more removable mechanical accessories.

In accordance with embodiments of the present disclosure, a method of making a mount structure configured to mechanically couple to a first connector and a second connector of a plurality of connectors, wherein each connector is configured to mechanically and electrically couple to a respective information handling resource, may include forming a first support structure, which may include a first attachment mechanism configured to mechanically couple to the first connector, and forming a second support structure, which may include a second attachment mechanism configured to mechanically couple to the second connector. The first support structure and second support structure may be connected by a top support structure, which may include a plurality of alignment features configured to mechanically couple to one or more removable mechanical accessories.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

Figure 1:
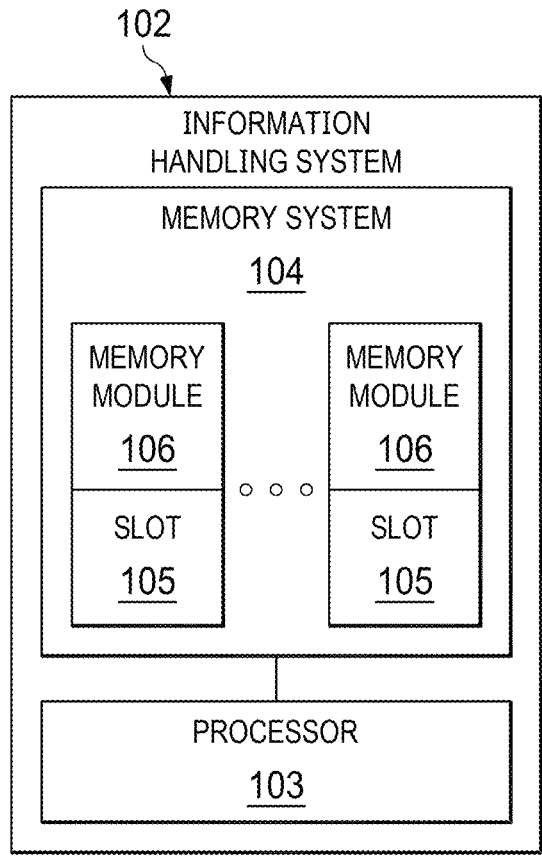
FIG. 1 illustrates a block diagram of an example information handling system, in accordance with embodiments of the present disclosure.

FIG. 1 illustrates a block diagram of selected components of an example information handling system 102, in accordance with embodiments of the present disclosure. In some embodiments, information handling system 102 may be a personal computer. In some embodiments, information handling system 102 may comprise or be an integral part of a server. In other embodiments, information handling system 102 may be a portable information handling system (e.g., a laptop, notebook, tablet, handheld, smart phone, personal digital assistant, etc.). As depicted in FIG. 1, information handling system 102 may include a processor 103 and a memory system 104 communicatively coupled to processor 103.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory system 104 and/or another component of information handling system 102.

Memory system 104 may be communicatively coupled to processor 103 and may include any system, device, or apparatus configured to retain program instructions and/or data for a period of time (e.g., computer-readable media). Memory system 104 may include RAM, EEPROM, a PCM-CIA card, flash memory, magnetic storage, opto-magnetic storage, or any suitable selection and/or array of volatile or non-volatile memory that retains data after power to information handling system 102 is turned off.

As shown in FIG. 1, memory system 104 may comprise a plurality of memory slots 105, each configured to receive a corresponding memory module 106. A memory slot 105 may include any system, device, or apparatus configured to receive a memory module 106 in order to electrically couple such memory module 106 to processor 103. Each memory module 106 may include any system, device or apparatus configured to retain program instructions and/or data for a period of time (e.g., computer-readable media). Each memory module 106 may include a dynamic random access memory (DRAM) module (e.g., a dual in-line package (DIP) memory, a Single In-line Pin Package (SIPP) memory, a Single-Inline Memory Module (SIMM), a Dual-Inline Memory Module (DIMM), a Ball Grid Array (BGA)), or any other suitable memory.

In addition to processor 103 and memory system 104, information handling system 102 may include one or more other information handling resources.

Figure 2A:
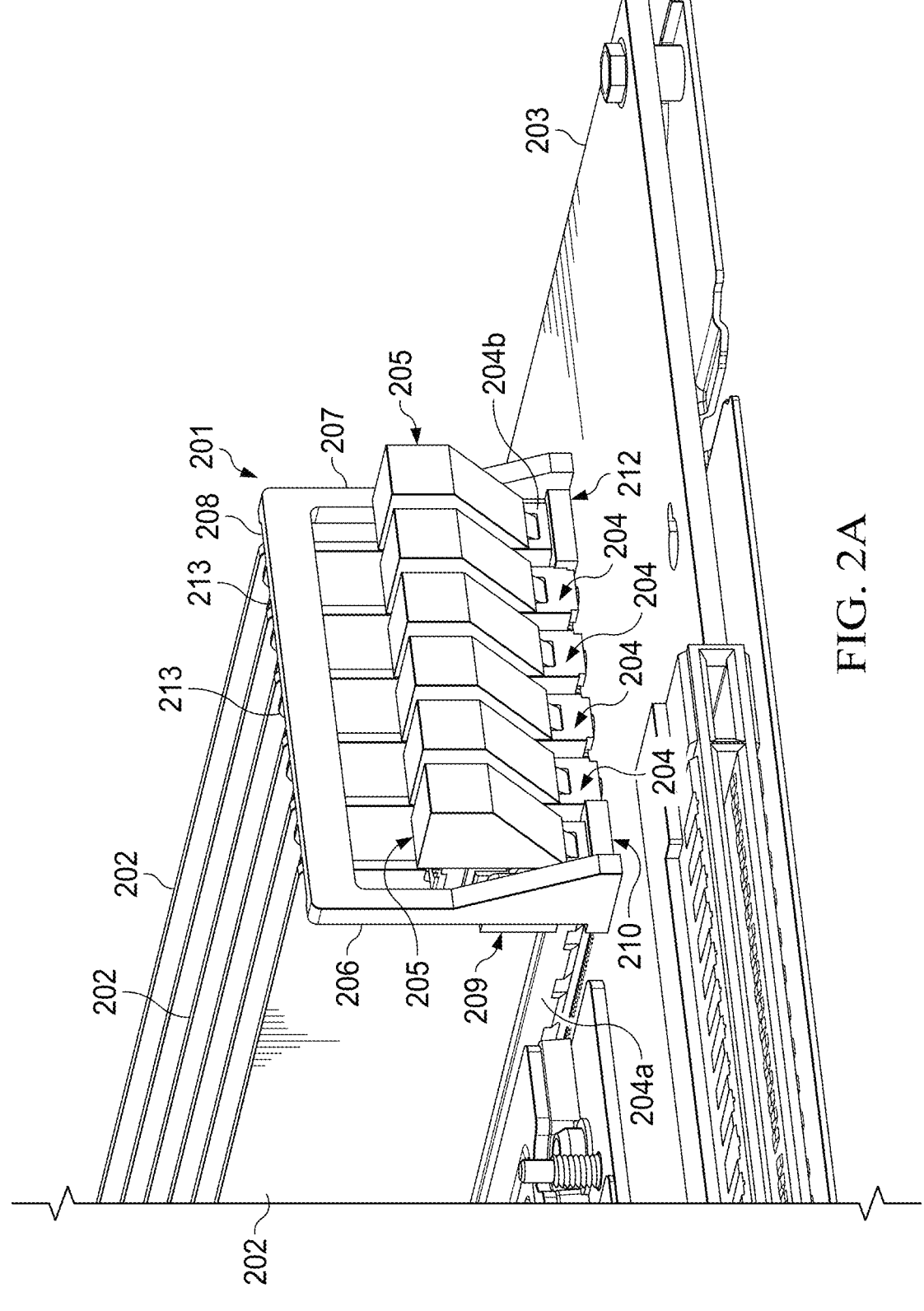
FIGS. 2A-2B illustrate various perspective views of an example mount mechanically coupled to an example plurality of receptacle connectors in an example information handling system, in accordance with embodiments of the present disclosure.
Figure 2B:
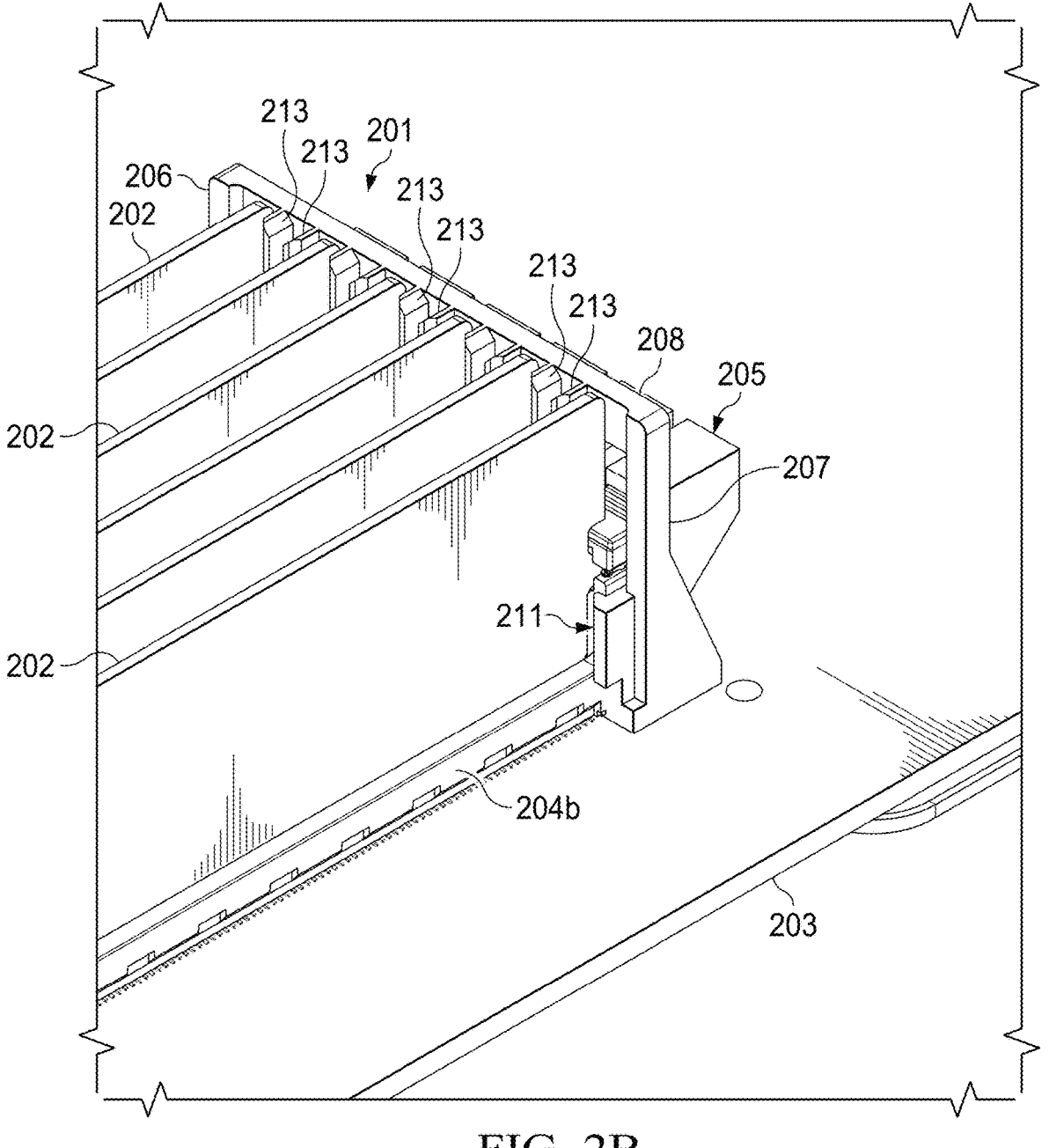

FIGS. 2A-2B illustrate various perspective views of an example mount 201 mechanically coupled to an example plurality of receptacle connectors 204 in an information handling system, in accordance with embodiments of the present disclosure. As shown in FIGS. 2A-2B, an information handling system may include a circuit board 203 (e.g., a motherboard or backplane) mechanically coupled to a plurality of receptacle connectors 204, each configured to receive a respective DIMM 202. As shown in FIGS. 2A-2B, DIMMs 202 and their respective receptacle connectors 204 may be arranged in an array. In some embodiments, each receptacle connector 204 may include one or more latching mechanisms 205 to mechanically retain an installed DIMM 202 in place within such receptacle connector 204. As described in further detail below, mount 201 may be configured to mechanically couple to all or a portion of the plurality of receptacle connectors 204, and may further be configured to mechanically couple to other removable mechanical accessories.

As shown in FIGS. 2A-2B, mount 201 may mechanically couple to a first outer receptacle connector 204a and second outer receptacle connector 204b. Mount 201 may comprise a first support 206 and a second support 207. A top structure 208 may connect a top of first support 206 and a top of second support 207. While not shown in FIGS. 2A-2B, in some embodiments a bottom structure may connect a bottom of first support 206 and a bottom of second support 207.

In some embodiments, first support 206 may comprise a first attachment mechanism 209 configured to mechanically couple to (e.g., snap onto) a side of first outer receptacle connector 204a. First support 206 may further comprise a second attachment mechanism 210 configured to mechanically couple to (e.g., snap onto) a base of first outer receptacle connector 204a. Similarly, second support 207 may comprise a third attachment mechanism 211 configured to mechanically couple to (e.g., snap onto) a side of second outer receptacle connector 204b. Second support 207 may further comprise a fourth attachment mechanism 212 configured to mechanically couple to (e.g., snap onto) a base of second outer receptacle connector 204b.

In some embodiments, a height of mount 201 may be such that a top surface of top structure 208 may be substantially level with top surfaces of DIMMs 202. As shown in FIGS. 2A-2B, top member 208 may include a plurality of constraints 213, which may protrude from top member 208. Constraints 213 may be spaced such that a pair of constraints 213 is configured to be positioned between each DIMM 202 when mount 201 is mechanically coupled to first outer receptacle connector 204a and second outer receptacle connector 204b.

Figure 3:
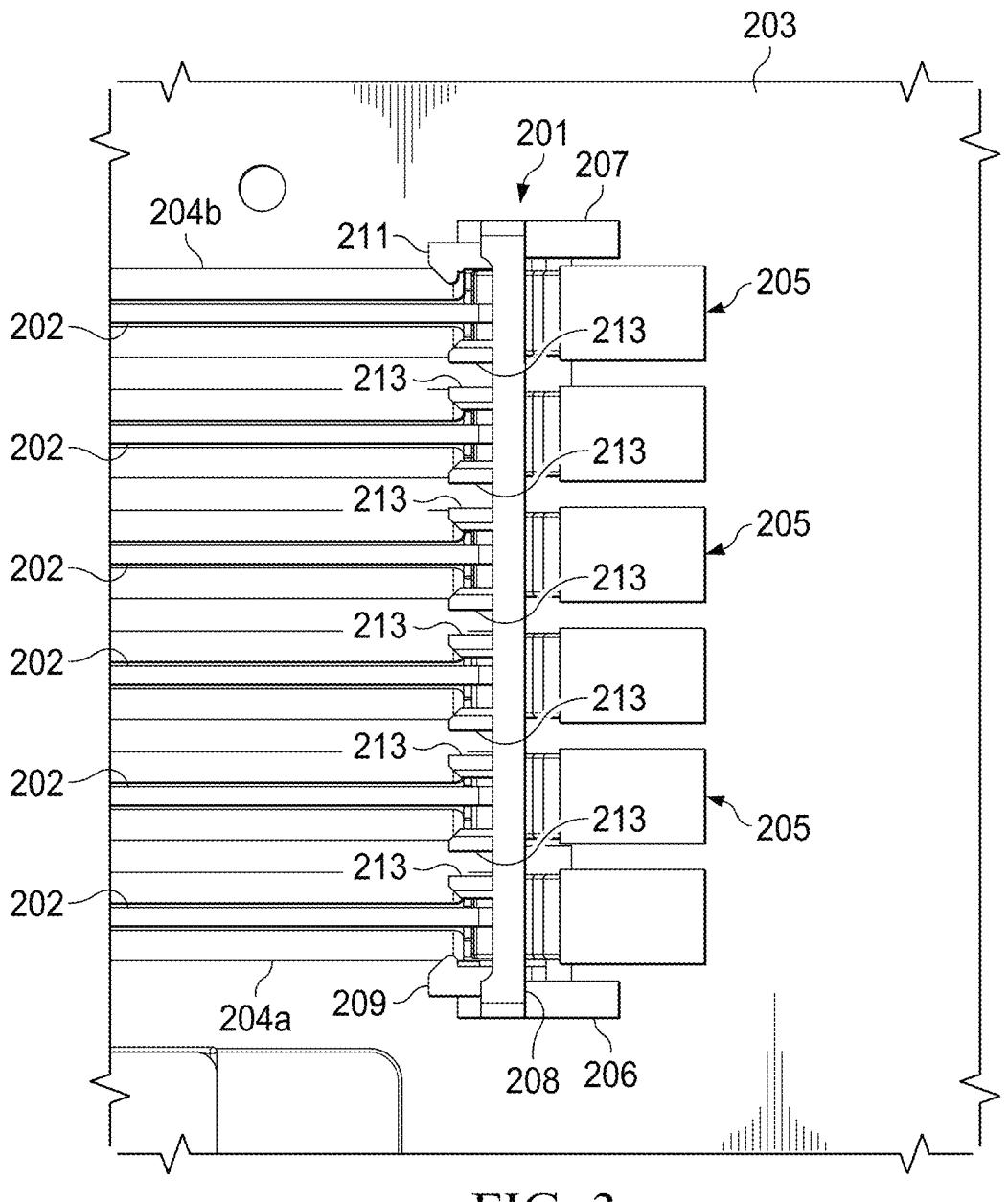
FIG. 3 illustrates a plan view of the example mount mechanically coupled to the example plurality of receptacle connectors in the example information handling system of FIGS. 2A-2B, in accordance with embodiments of the present disclosure.

FIG. 3 illustrates a plan view of mount 201 mechanically coupled to the plurality of receptacle connectors 204 in the example information handling system of FIGS. 2A-2B, in accordance with embodiments of the present disclosure. As shown in FIG. 3, pairs of constraints 213 may be spaced across top member 208 such that each pair of constraints 213 is positioned between each DIMM 202. As shown in FIG. 3, and as further described below, each pair of constraints 213 may comprise a gap configured to align and constrain a removable mechanical accessory. As shown in FIG. 3, constraints 213 may be positioned across top member 208 such that there is space between each constraint 213 and an adjacent DIMM 202. Thus, mount 201 may be configured to mount a removable mechanical accessory in close proximity to a DIMM 202 while preventing the removable mechanical accessory from coming into contact with and/or damaging DIMM 202.

Figure 4:
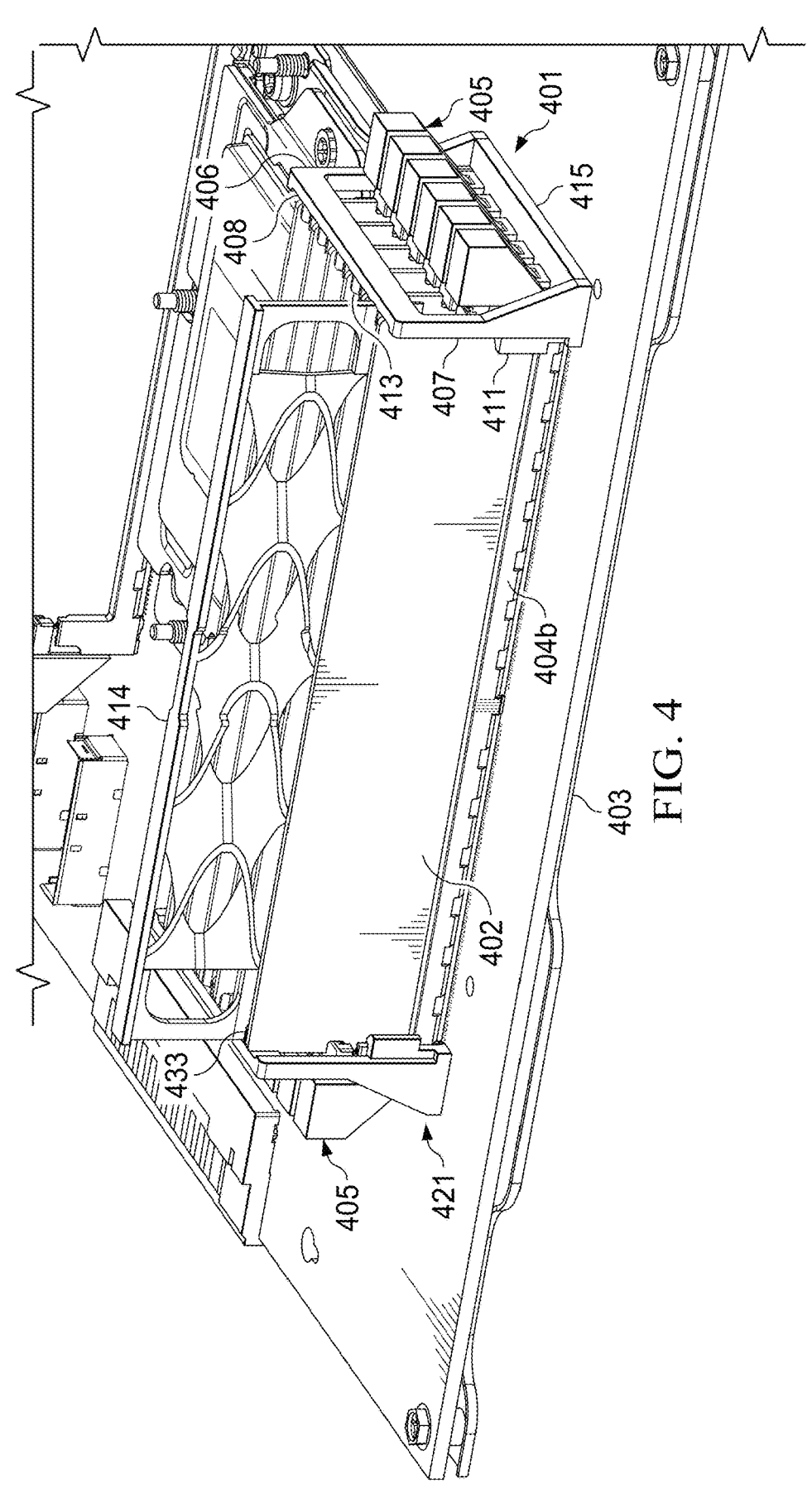
FIG. 4 illustrates a perspective view of an example mount system mechanically coupled to an example plurality of receptacle connectors in an example information handling system, and demonstrates installation of an example thermal insert, in accordance with embodiments of the present disclosure.

FIG. 4 illustrates a perspective view of a mount system mechanically coupled to an example plurality of receptacle connectors 404 in an example information handling system, and demonstrates installation of an example thermal insert 414, in accordance with embodiments of the present disclosure.

As shown in FIG. 4, receptacle connectors 404 may be mechanically coupled to circuit board 403 such that corresponding DIMMs 402 are arranged in an array. In some embodiments, a mount 401 may mechanically couple to first outer receptacle connector 404a and second outer receptacle connector 404b at a first end of the array of DIMMs 402, and a mount 421 may mechanically couple to first outer receptacle connector 404a and second outer receptacle connector 404b at a second end of the array of DIMMs 402. In some embodiments, mount 401 and mount 421 may be substantially similar such that when mount 401 and mount 421 mechanically couple to the first outer receptacle connector 404a and second outer receptacle connector 404b, constraints 413 of mount 401 and constraints 433 of mount 421 may align such that a removable mechanical accessory (e.g., thermal insert 414) may be inserted between constraints 413 and constraints 433. For example, as shown in FIG. 4, a thermal insert 414 may be inserted between a pair of constraints 413 and a pair of constraints 433 to improve cooling of DIMMs 402. While FIG. 4 shows thermal insert 414 extending partially above DIMMs 402 for exposition purposes, one of ordinary skill in the art would understand thermal insert 414 may be fully lowered between DIMMs 402. Thus, mount 401 and mount 421 may align and constrain thermal insert 414 during installation and normal use such that thermal insert 414 may avoid touching and/or damaging DIMMs 402.

As shown in FIG. 4, mount 401 and mount 421 may be substantially similar to each other, and may further be substantially similar to mount 201 of FIGS. 2A-2B. In some embodiments, mount 401 may further comprise a bottom member 415, which may connect first support 406 to second support 407. However, in some embodiments bottom structure 415 may be absent (as shown in FIGS. 2A-2B). While FIG. 4 shows a single thermal insert 414, one of ordinary skill in the art may understand that any suitable number of thermal inserts 414 may be inserted between DIMMs 402. Furthermore, while FIG. 4 shows thermal insert 414 inserting between DIMMs 402, one of ordinary skill in the art would understand that mount 401 and mount 421 may be compatible with any other suitable removable mechanical accessory.

Figure 5:
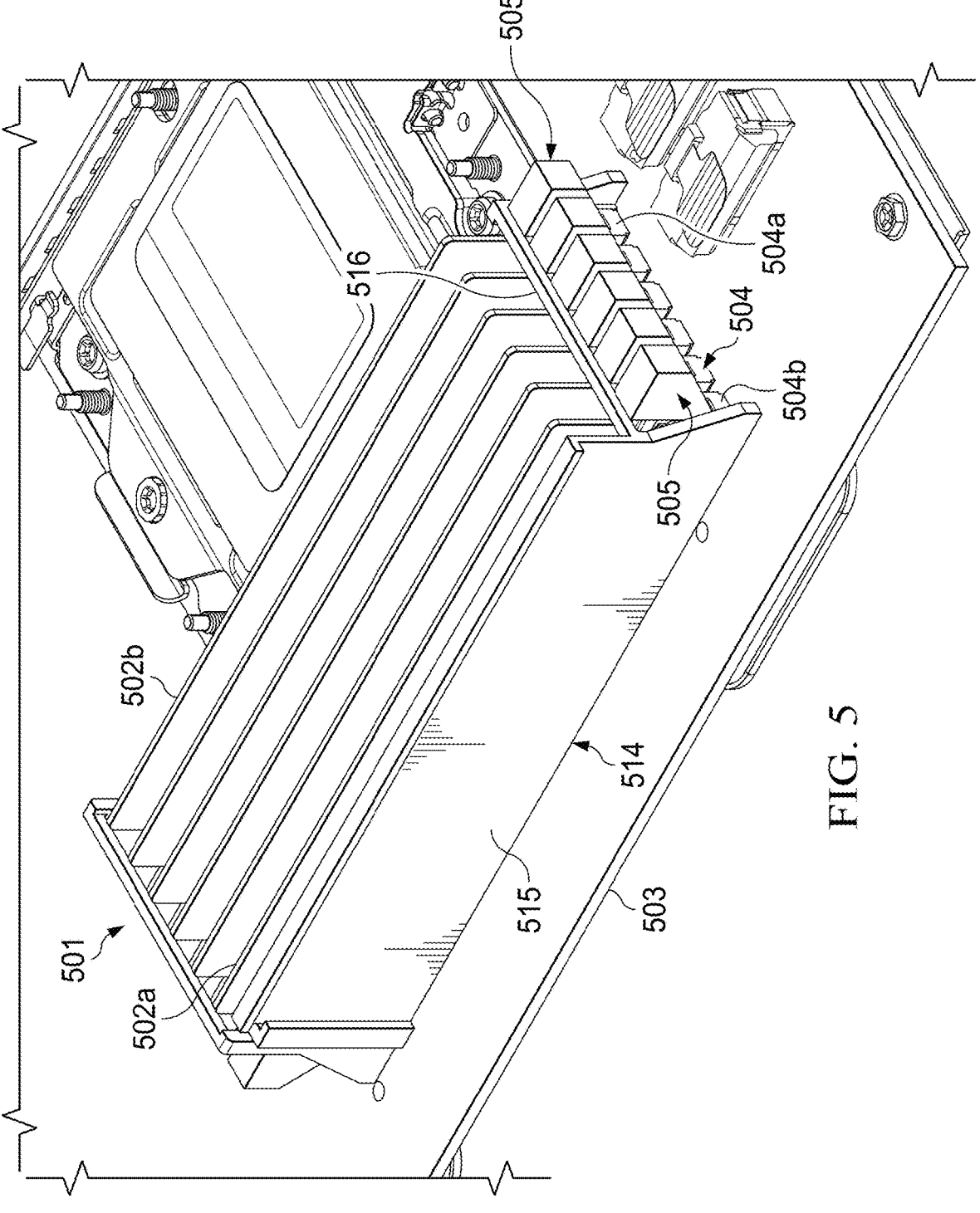
FIG. 5 illustrates a perspective view of an example mount mechanically coupled to an example plurality of receptacle connectors and to an example guard insert, in accordance with embodiments of the present disclosure.

FIG. 5 illustrates a perspective view of an example mount 501 mechanically coupled to an example plurality of receptacle connectors 504 and to an example guard insert 514, in accordance with embodiments of the present disclosure.

As shown in FIG. 5, the plurality of receptacle connectors 504 may be arranged in an array on circuit board 503 and may each be configured to receive a corresponding DIMM 502. Mount 501 may mechanically couple to a first outer receptacle connector 504a and a second outer receptacle connector 504b. Mount 501 may be substantially similar to mount 201, mount 401, and mount 421, as described above. Mount 501 may further be configured to mechanically couple to a guard insert 514 such that guard insert 514 protects an outermost DIMM 502a. While FIG. 5 shows guard insert 514 positioned on a first side of receptacle connectors 504, one of ordinary skill in the art may understand guard insert 514 may be positioned on a second side of receptacle connectors 504 (e.g., such that guard insert 514 protects an outermost DIMM 502b). While FIG. 5 shows a single guard insert 514, one of ordinary skill in the art may understand mount 501 may be configured to mechanically couple to any suitable number of guard inserts 514.

In some embodiments, guard insert 514 may comprise a main body 515. Main body 515 may be substantially flat and may be substantially similar in dimension to a DIMM 502. In some embodiments, main body 515 may be configured to protect DIMMs 502 from an information handling resource (e.g., a cable). Guard 514 may further comprise a bar 516 extending substantially perpendicular to main body 515. Bar 516 may be configured such that when guard 514 is mechanically coupled to mount 501, bar 516 may be positioned above latching mechanisms 505.

Although the foregoing describes mounting mechanical accessories in near proximity to DIMMs in an information handling system, it is understood that the methods and systems described herein may be applied for mounting any suitable mechanical accessories in an information handling system.

One of skill in the art would further understand that a height and a width of the mount disclosed herein may be adjusted to be compatible with an array of receptacle connectors and their corresponding DIMMs comprising any number of receptacle connectors and their corresponding DIMMS.

While the terms "top" and "bottom" are used for purposes of exposition and clarity, such terms are not intended to limit any of the mounts disclosed herein to a particular orientation or configuration.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112 (f) unless the words "means for" or "step for" are explicitly used in the particular claim.

What is claimed is:

1. An information handling system comprising:
   a plurality of connectors, wherein each connector is configured to mechanically and electrically couple to a respective information handling resource; and
   a mount structure configured to mechanically couple to a first connector and a second connector of the plurality of connectors, wherein the mount structure comprises:
      a first support structure comprising a first attachment mechanism configured to mechanically couple to the first connector;
      a second support structure comprising a second attachment mechanism configured to mechanically couple to the second connector; and
      a top support structure connecting the first support structure and the second support structure, wherein the top support structure comprises a plurality of alignment features configured to mechanically couple to one or more removable accessories, wherein the plurality of alignment features are further configured to prevent the one or more removable accessories from coming into contact with the information handling resources.

2. The information handling system of claim 1, wherein the mount structure is further configured to couple to the one or more removable mechanical accessories such that the one or more removable mechanical accessories are arranged in alternating order with the information handling resources.

3. The information handling system of claim 2, wherein the one or more removable mechanical accessories comprises a thermal insert.

4. The information handling system of claim 1, wherein the mount structure is further configured to couple to the one or more removable mechanical accessories such that the one or more removable mechanical accessories are positioned outside of the plurality of connectors.

5. The information handling system of claim 4, wherein the one or more removable mechanical accessories comprises a guard insert configured to protect the information handling resources.

6. A mount structure configured to mechanically couple to a first connector and a second connector of a plurality of connectors, wherein each connector is configured to mechanically and electrically couple to a respective information handling resource, and wherein the mount structure comprises:
   a first support structure comprising a first attachment mechanism configured to mechanically couple to the first connector; and a second support structure comprising a second attachment mechanism configured to mechanically couple to the second connector; and a top support structure connecting the first support structure and the second support structure, wherein the top support structure comprises a plurality of alignment features configured to mechanically couple to one or more removable mechanical accessories, wherein the plurality of alignment features are further configured to prevent the one or more removable mechanical accessories from coming into contact with the information handling resources.

7. The mount structure of claim 6, wherein the mount structure is further configured to couple to the one or more removable mechanical accessories such that the one or more removable mechanical accessories are arranged in alternating order with the information handling resources.

8. The mount structure of claim 7, wherein the one or more removable mechanical accessories comprises a thermal insert.

9. The mount structure of claim 6, wherein the mount structure is further configured to couple to the one or more removable mechanical accessories such that the one or more removable mechanical accessories are positioned outside of the plurality of connectors.

10. The mount structure of claim 9, wherein the one or more removable mechanical accessories comprises a guard insert configured to protect the information handling resources.

11. A method of making a mount structure configured to mechanically couple to a first connector and a second connector of a plurality of connectors, wherein each connector is configured to mechanically and electrically couple to a respective information handling resource, the method comprising:

forming a first support structure comprising a first attachment mechanism configured to mechanically couple to the first connector; and forming a second support structure comprising a second attachment mechanism configured to mechanically couple to the second connector; and wherein the first support structure and second support structure are connected by a top support structure comprising a plurality of alignment features configured to mechanically couple to one or more removable mechanical accessories, wherein the plurality of alignment features are further configured to prevent the one or more removable mechanical accessories from coming into contact with the information handling resources.

12. The method of claim 11, wherein the mount structure is further configured to couple to the one or more removable mechanical accessories such that the one or more removable mechanical accessories are arranged in alternating order with the information handling resources.

13. The method of claim 12, wherein the one or more removable mechanical accessories comprises a thermal insert.

14. The method of claim 11, wherein the mount structure is further configured to couple to the one or more removable mechanical accessories such that the one or more removable mechanical accessories are arranged outside of the plurality of connectors.

15. The mount structure of claim 14, wherein the one or more removable mechanical accessories comprises a guard insert configured to protect the information handling resources.

* * * * *